United States Patent

[11] 3,576,477

[72] Inventor Else Kooi
Emmasingel, Eindhoven, Netherlands
[21] Appl. No. 828,799
[22] Filed May 21, 1969
[45] Patented Apr. 27, 1971
[73] Assignee U.S. Philips Corporation
New York, N.Y.
[32] Priority May 23, 1968
[33] Netherlands
[31] 6807317

[54] INSULATED GATE FET WITH SELECTIVELY DOPED THICK AND THIN INSULATORS
4 Claims, 2 Drawing Figs.

[52] U.S. Cl. .......... 317/235, 317/234
[51] Int. Cl. .......... H01l 11/14
[50] Field of Search .......... 317/235/21.1; 11/235

[56] References Cited
UNITED STATES PATENTS

| | | | |
|---|---|---|---|
| 3,246,173 | 4/1966 | Silver .......... | 317/235X |
| 3,386,016 | 5/1968 | Lindmayer .......... | 317/235 |
| 3,428,875 | 2/1969 | Snow .......... | 317/235 |
| 3,440,500 | 4/1969 | Coppen .......... | 317/235 |
| 3,450,961 | 6/1969 | Tsai .......... | 317/235 |

*Primary Examiner*—James D. Kallam
*Attorney*—Frank R. Trifari

ABSTRACT: An insulated gate field effect transistor is described having a thin insulator under the gate and a thick insulator under source and drain connections. The insulator over the source and drain is impurity doped, which impurity is diffused into the semiconductor body to form the source and drain. However, the insulator under the gate is a mask against diffusion of the said impurity.

INVENTOR.
ELSE KOOI
BY
Frank R. Trifari
AGENT

INSULATED GATE FET WITH SELECTIVELY DOPED THICK AND THIN INSULATORS

The invention relates to a field effect transistor of the type having an insulated gate electrode, comprising a semiconductor body of which at least a part is of one conductivity-type, which part comprises two juxtaposed diffused surface regions, the source and drain regions, while on a surface of the said part and across the surface regions an insulating layer is provided which has a greater thickness on the surface regions than between said regions, the impurity determining the conductivity-type of the surface regions being also present in the thick parts of the insulating layer situated on the surface regions, the gate electrode being provided on the thin part of the insulating layer between the surface regions, the surface regions being contacted through apertures in the insulating layer. The invention relates also to a method of manufacturing such a field effect transistor.

A field effect transistor of the above-mentioned type has been described by S.R. Hofstein in "I.E.E.E.—Transactions on Electron Devices," ED.13, Nr.12, Feb. 1966, pp.222—237, see particularly page 223, and has the advantage that it can be manufactured in a simple manner without the use of a precision photoresist method, that is to say without a photoresist method by means of which, for example, a region or layer has to be provided or removed at a place which is very accurately determined with respect to regions or layers already provided or removed previously.

The gate electrode may be provided, for example, with a comparatively large tolerance on the thin insulating layer between the source and drain regions. When the gate electrode slightly overlaps the thick parts of the insulating layer provided on the source and drain regions, this has little influence on the electric properties of the field effect transistor, since the capacities caused by said overlap between the gate electrode and the source and drain regions, which capacities are preferably as small as possible, are small due to the large thickness of the insulating layer on the source and drain regions, while due to the presence of the thin part of the insulating layer, just a desirable large capacity is possible between the gate electrode and the part of the semiconductor body, the channel region, situated between the source and drain regions.

When in the present description there is said that the insulating layer between the source and drain regions (the surface regions) is thinner than on these regions and the gate electrode is provided on the thin part situated between said regions, this is to be understood to mean that the thin part of the insulating layer and the gate electrode can slightly overlap the source and drain regions.

The insulating layer of the said known field effect transistor is thick only above the source and drain regions. Usually, metal layers are provided on the insulating layer which are connected to the gate electrode and, through apertures in the insulating layer, to the source and drain regions, in which it is possible that said metal layers are furthermore connected to other circuit elements provided in the semiconductor body and/or are provided with connection conductors and in which said metal layers are provided at least for a considerable part on parts of the insulating layer which are not situated on the source and drain regions. However, said metal layers are preferably provided on a thick insulating layer, inter alia to restrict the capacity between said metal layers and the semiconductor body and to restrict the possibility of short circuit between a metal layer and the semiconductor body via a pinhole in the insulating layer.

It is one of the objects of the invention to provide a field effect transistor having an insulating layer which is thin only between the source and drain regions and which moreover has the same advantage as the said known transistor and can be manufactured in a simple manner.

According to the invention, a field effect transistor of the type mentioned in the preamble is characterized in that the insulating layer beyond the part of said layer which is situated on and between the surface regions has a greater thickness than the part on the surface regions, and comprises a layer part adjoining the semiconductor body which is substantially free from the said impurity and has a masking effect against diffusion of said impurity and situated on this layer part a further layer part which is comprising said impurity.

According to the invention, a method of manufacturing such a field effect transistor of the type having an insulated gate electrode, in which an insulating layer comprising the impurity to be diffused is provided on a surface of a part of one conductivity type of a semiconductor body above the juxtaposed surface regions the source and drain regions, to be provided, the impurity for forming the surface regions is diffused from said insulating layer in the semiconductor body, and an insulating layer is provided between the surface regions on the semiconductor body which layer is thinner than the insulating layer comprising the impurity, after which the gate electrode is provided on the thin layer and the surface regions are contacted, is characterized in that first an insulating layer masking against the diffusion is provided on the said surface, which layer leaves said surface exposed above and between the surface regions to be provided, after which the insulating layer comprising the impurity to be diffused is provided on the masking layer and on the said surface above the surface regions to be provided.

Due to the provision of the masking layer and by providing the insulating layer comprising the impurity to be diffused not only above the source and drain regions to be provided but also on the masking layer, an insulating layer is obtained which is thin only between the source and drain regions while no precision photoresist method is introduced. The resulting insulating layer comprises the masking layer, the layer containing the impurity, and the thin insulating layer.

The masking layer preferably consists of at least one of the materials silicon oxide and silicon nitride.

The layer containing the impurity may consist of silicon oxide and may be doped, for example, with phosphorus if *n*-type surface regions are desired or with boron if *p*-type surface regions are desired.

When the semiconductor body consists of silicon, the thin insulating layer may consist of silicon oxide and may be obtained by an oxidation treatment during the diffusion of the impurity. The thin insulating layer may also be obtained, for example, by depositing insulating material, a further thin layer being provided also on the layer containing the impurity.

The thin insulating layer may consist, for example, over at least part of its thickness, also of silicon nitride or aluminum oxide.

In order that the invention may be readily carried into effect, one example thereof will now be described in greater detail, with reference to the accompanying drawing, in which.

Figures 1, 2:
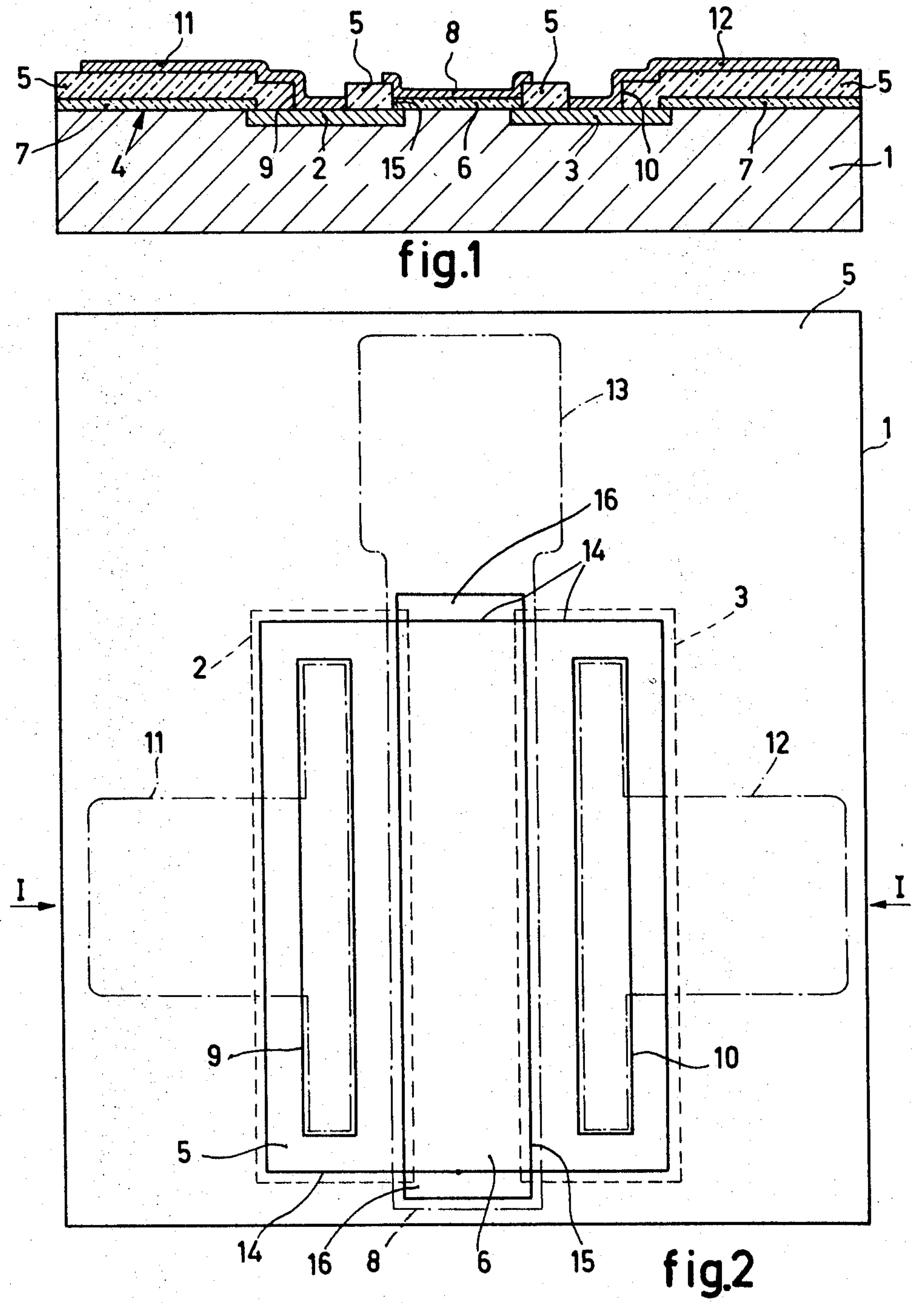
FIG. 1 is a diagrammatic cross-sectional view taken on the line I–I of FIG. 2 of an example of a field effect transistor according to the invention.
FIG. 2 is a diagrammatic plan view of the said field effect transistor.

The field effect transistor of the type having an insulated gate electrode shown in FIGS. 1 and 2 comprises a semiconductor body 1 of one conductivity type in which two juxtaposed diffused surface regions 2 and 3 of the opposite conductivity-type, the source and drain regions, are provided. On the surface 4 of the semiconductor body 1 and across the regions 2 and 3 an insulating layer 5, 6, 7 is provided which above the surface regions 2 and 3 has a greater thickness than between said regions. The impurity determining the conductivity type of the regions 2 and 3 is also present in the thick parts of the insulating layer 5, 6, 7 situated on the regions 2 and 3. The gate electrode 8 is provided on the thin part 6 of the insulating layer 5, 6, 7. The regions 2 and 3 are contacted via the apertures 9 and 10 in the insulating layer 5, 6, 7.

According to the invention, the part 5, 7 of the insulating layer 5, 6, 7 beyond the part 5, 6 of said layer which is situated on and between the regions 2 and 3 has a greater thickness than the parts 5 situated on the surface regions 2 and 3 and comprises a layer part 7 adjoining the semiconductor body 1 which is substantially free from the said impurity and has a masking effect against diffusion of the said impurity, and situated on this layer part a further layer part 5 comprising said impurity.

The field effect transistor described is manufactured by providing an insulating layer 5 on the surface 4 of the semiconductor body 1 of one conductivity type above the juxtaposed surface regions 2 and 3 of the other conductivity-type, the source and drain regions, to be provided, which layer 5 comprises an impurity to be diffused, and diffusing said impurity from the layer 5 in the semiconductor body 1 in which the diffused regions 2 and 3 are obtained, and providing a thin insulating layer 6 between the regions 2 and 3 on which layer 6 the gate electrode 8 is provided. The regions 2 and 3 are contacted through the apertures 9 and 10 in the layer 5. The regions 2 and 3 having a thick insulating layer 5 on said regions and the thin insulating layer 6 between said regions, which layer 6 is provided with the gate electrode 8, are obtained without using a precision photoresist method.

In known methods of this type, a thin insulating layer is also provided at the location of the thick insulating layer 5, 7 simultaneously with the thin layer 6, so that a thick insulating layer is present only on the regions 2 and 3 and the metal layers 11, 12 and 13 which are connected to the regions 2 and 3 and the gate electrode 8, respectively, and to which connection conductors can be connected, have to be provided on a thin insulating layer. This has the drawback that the capacity between the metal layers and the semiconductor body is large while the possibility of short circuit through a pinhole in the thin insulating layer is comparatively large. In a method according to the invention said drawbacks are avoided.

According to the invention, first an insulating layer 7 masking against diffusion is provided on the surface 4 of the semiconductor body 1, which layer leaves said surface exposed above and between the regions 2 and 3 to be provided, after which an insulating layer 5 comprising the impurity to be diffused is provided on the masking layer 7 and on the surface 4 above the regions 2 and 3 to be provided. Without the introduction of a precision photoresist method, an insulating layer 5, 6, 7 is obtained which is only thin between the regions 2 and 3.

It is to be noted that, for reasons of clarity, the diffused regions 2 and 3, the gate electrode 8 and the metal layers 11, 12 and 13 in FIG. 2 are shown in broken lines.

Starting material is, for example, a *p*-type monocrystal line silicon body 1 having a resistivity of approximately 10 ohm.cm. and a thickness of approximately 200 $\mu m$. The further dimensions of the body 1 are of no significance and must be only sufficiently large to be able to provide the field effect transistor.

Usually a number of field effect transistors will simultaneously be provided in a semiconductor body and the silicon body will then be subdivided so as to obtain individual field effect transistors.

A silicon oxide layer, thickness approximately 0.3 $\mu$, is provided on the body 1 in a conventional manner, for example, by oxidation. By means of any conventional photoresist method an aperture is etched in the said layer after which the masking layer 7 with the aperture 14 is obtained. The dimensions of the aperture 14 are approximately 65 $\mu m \times 950$ $\mu m$.

A strongly phosphorus doped silicon oxide layer 5, thickness approximately 1 $\mu m$, is then deposited in any conventional manner on the layer 7 and in the aperture 14.

This may be done for example, by heating the silicon body at a temperature of approximately 500° C. and passing nitrogen over the semiconductor body which contains tetraethoxy silane and trimethyl phosphate, until a phosphorus-containing silicon oxide layer having a thickness of approximately 1 $\mu$ is obtained.

By means of a photoresist method, the elongate aperture 15, dimensions approximately 1000 $\mu m \times 15$ $\mu m$, is provided in the layer 5. As shown in FIG. 2, the aperture 15 overlaps the previously provided and again closed aperture 14 slightly at the ends 16 of the elongate aperture 15. At these ends 16, small parts of the masking layer 7 may also be removed, if desirable. Often, however, this will not be necessary. The location of the aperture 15 is not very critical.

By heating for approximately 2 hours at a temperature of approximately 1100° C. in an inert atmosphere, phosphorus is diffused into the body 1 from the layer 5 and the diffused regions 2 and 3, thickness approximately 3 $\mu m$, are obtained.

Heating may take place temporarily in an oxidizing atmosphere, the thin insulating silicon oxide layer 6, thickness approximately 0.1 $\mu$, being obtained. The layer 6 may alternatively be obtained by depositing silicon oxide, a layer 6 being obtained which extends also over the layer 5.

By means of any conventional photoresist method the apertures 9 and 10, dimensions approximately 850 $\mu m \times 10$ $\mu m$, are then provided in the layer 5, after which in any conventional manner the gate electrode 8 and the metal layers 11, 12 and 13 are provided. The gate electrode 8 and the metal layers 11, 12, and 13, may consist of aluminum.

Supply conductors may be connected in any conventional manner to the metal layers 11, 12 and 13, and the resulting field effect transistor may be provided with an envelope in any commonly used method.

It will be obvious that the invention is not restricted to the examples described and that many variations are possible to those skilled in the art without departing from the scope of this invention. For example, the silicon body 1 may be *n*-conductive and the regions 2 and 3 may be *p*-conductive, in which the layer 5 and the regions 2 and 3 may be doped with boron. The masking layer 7 may consist at least partly of silicon nitride. A field effect transistor according to the invention may have a configuration differing from that described. The regions 2 and 3 may form, for example, an interdigital pattern. The semiconductor body of the field effect transistor may comprise a number of further circuit elements, for example, further field effect transistors, bipolar transistors, diodes, resistors and capacities, the circuit elements being electrically interconnected. The semiconductor body of the field effect transistor may consist of a thin semiconductor layer of one conductivity type provided, for example, on an insulating support, in which the source and drain regions may extend throughout the thickness of the semiconductor layer and may be both of one and of the opposite conductivity-type.

I claim:

1. An insulated-gate field effect transistor comprising a semiconductor body having a substrate portion of one conductivity-type and in the substrate portion spaced source and drain surface regions of the opposite conductivity type defining a channel region therebetween, the source and drain regions containing an impurity forming said opposite conductivity type in a distribution decreasing from the surface into the bulk, a first insulating layer substantially free of said impurity on the substrate surface overlying the channel region and on the substrate surface extending at least partly beyond the source and drain regions, a second insulating layer doped with said impurity on the surface of the source and drain regions and on the first insulating layer portions extending beyond the source and drain regions, openings in the second insulating layer over the source and drain regions, contact means extending through the openings into contact with the source and drain regions forming source and drain contacts, and a conductive layer on the first insulating layer over the channel region and forming a gate electrode, said first insulating layer exhibiting a masking effect against diffusion therethrough of the said impurity, whereby the gate electrode is on a thin dielectric over the channel region whereas a combined thicker dielectric is on the substrate surface beyond the source and drain regions.

2. A transistor as set forth in claim 1 wherein the source and drain contact means comprise conductive layers on the second insulating layer over the first insulating layer and extending through the openings into contact with the source and drain regions.

3. A transistor as set forth in claim 2 wherein the first insulator is thinner than the second insulator.

4. A transistor as set forth in claim 3 wherein the gate comprises a conductive layer on the second insulating layer extending into contact with the gate electrode.